US011596048B2

United States Patent
Bezel et al.

(10) Patent No.: US 11,596,048 B2
(45) Date of Patent: Feb. 28, 2023

(54) ROTATING LAMP FOR LASER-SUSTAINED PLASMA ILLUMINATION SOURCE

(71) Applicant: KLA Corporation, Milpitas, CA (US)

(72) Inventors: Ilya Bezel, Mountain View, CA (US); Leonid Borisovich Zvedenuk, Moscow (RU); Andrey Evgenievich Stepanov, Moscow (RU); Maksim Alexandrovich Deminskii, Moscow (RU); Boris Vasilyevich Potapkin, Moscow (RU)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/024,565

(22) Filed: Sep. 17, 2020

(65) Prior Publication Data
US 2021/0092826 A1    Mar. 25, 2021

Related U.S. Application Data

(60) Provisional application No. 62/904,289, filed on Sep. 23, 2019.

(51) Int. Cl.
*H05H 1/24* (2006.01)
*H01J 37/32* (2006.01)

(52) U.S. Cl.
CPC ......... *H05H 1/24* (2013.01); *H01J 37/32339* (2013.01)

(58) Field of Classification Search
CPC ... H05H 1/24; H05H 1/2431; H01J 37/32339; H01J 37/32449; H01J 65/04; H01J 65/06; H01J 61/26
See application file for complete search history.

(56) References Cited

U.S. PATENT DOCUMENTS

| 5,608,526 | A | 3/1997 | Piwonka-Corle et al. |
| 5,866,990 | A * | 2/1999 | Ury .................. H01J 61/52 |
| | | | 315/112 |
| 5,999,310 | A | 12/1999 | Shafer et al. |
| 6,297,880 | B1 | 10/2001 | Rosencwaig et al. |
| 7,345,825 | B2 | 3/2008 | Chuang et al. |
| 7,435,982 | B2 | 10/2008 | Smith |
| 7,525,649 | B1 | 4/2009 | Leong et al. |
| 7,705,331 | B1 | 4/2010 | Kirk et al. |
| 7,786,455 | B2 | 8/2010 | Smith |

(Continued)

FOREIGN PATENT DOCUMENTS

WO    2012134853 A1    10/2012

OTHER PUBLICATIONS

PCT International Search Report and Written Opinion for International Application No. PCT/US2020/051892 dated Jan. 8, 2021, 7 pages.

*Primary Examiner* — Thai Pham
(74) *Attorney, Agent, or Firm* — Suiter Swantz pc llo

(57) ABSTRACT

A broadband light source is disclosed. The broadband light source includes a rotatable gas containment structure. The broadband light source includes a rotational drive system configured to rotate the rotatable gas containment structure about the horizontal axis of rotation of the rotatable gas containment structure. The broadband light source includes a pump source configured to generate pump illumination and a reflector element configured to direct a portion of the pump illumination into the gas to sustain a plasma. The reflector is configured to collect a portion of broadband light emitted from the plasma.

21 Claims, 14 Drawing Sheets

(56) References Cited

U.S. PATENT DOCUMENTS

| | | |
|---|---|---|
| 7,957,066 B2 | 6/2011 | Armstrong et al. |
| 7,989,786 B2 | 8/2011 | Smith et al. |
| 8,182,127 B2 | 5/2012 | Yasuda et al. |
| 8,309,943 B2 | 11/2012 | Smith et al. |
| 8,525,138 B2 | 9/2013 | Smith et al. |
| 8,921,814 B2 | 12/2014 | Pellemans et al. |
| 9,099,292 B1 | 8/2015 | Bezel et al. |
| 9,185,788 B2 | 11/2015 | Bezel et al. |
| 9,228,943 B2 | 1/2016 | Wang et al. |
| 9,263,238 B2 | 2/2016 | Wilson et al. |
| 9,318,311 B2 | 4/2016 | Chimmalgi et al. |
| 9,390,902 B2 * | 7/2016 | Bezel .................... H01J 65/042 |
| 9,775,226 B1 | 9/2017 | Bezel et al. |
| 2012/0050706 A1 * | 3/2012 | Levesque ............. G02B 5/0891 |
| | | 250/504 R |
| 2014/0291546 A1 * | 10/2014 | Bezel .................... H01J 61/523 |
| | | 250/432 R |
| 2015/0076359 A1 * | 3/2015 | Bykanov ................. G21B 1/23 |
| | | 250/504 R |
| 2015/0316857 A1 * | 11/2015 | Berry, III ............ G03F 7/70341 |
| | | 355/30 |

\* cited by examiner

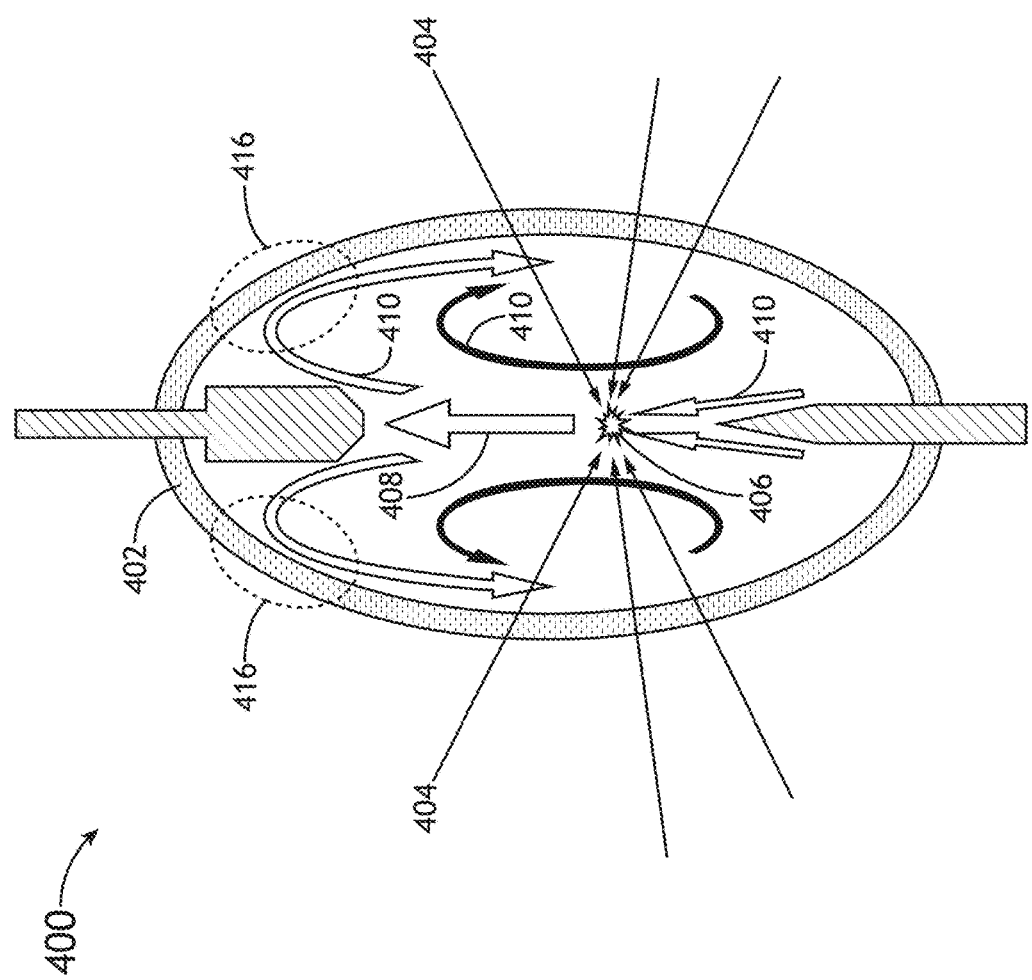

0 RPM

Temperature

Velocity

1200 RPM

Temperature

Velocity

6000 RPM

Temperature

Velocity

US 11,596,048 B2

ROTATING LAMP FOR LASER-SUSTAINED PLASMA ILLUMINATION SOURCE

CROSS-REFERENCE TO RELATED APPLICAITON

The present application claims the benefit under 35 U.S.C. § 119(e) of U.S. Provisional Application Ser. No. 62/904,289, filed Sep. 23, 2019, which is incorporated herein by reference in the entirety.

TECHNICAL FIELD

The present invention generally relates to a laser sustained plasma (LSP) broadband light source and, in particular, an LSP lamphouse equipped with a rotating rotatable gas containment structure.

BACKGROUND

The need for improved light sources used for inspection of ever-shrinking semiconductor devices continues to grow. One such light source includes a laser sustained plasma (LSP) broadband light source. LSP broadband light sources include LSP lamps, which are capable of producing high-power broadband light. LSP lamps suffer from uneven thermal distribution on the glass of the lamp and from convection-induced noise in the laser pump illumination. Consequently, the plasma light output from the lamp is reduced. These problems become larger at higher and higher pumping powers. As such, it would be advantageous to provide a system and method to remedy the shortcomings of the conventional approaches identified above.

SUMMARY

A broadband plasma light source is disclosed. In one illustrative embodiment, the broadband plasma light source includes a rotatable gas containment structure for containing a gas. In another illustrative embodiment, the broadband plasma light source includes a rotational drive system configured to rotate the rotatable gas containment structure about an axis. In another illustrative embodiment, the broadband plasma light source includes a pump source configured to generate pump illumination. In another illustrative embodiment, the broadband plasma light source includes a reflector element configured to direct a portion of the pump illumination into the gas to sustain a plasma, wherein the reflector is configured to collect at least a portion of broadband light emitted from the plasma.

An optical characterization system is disclosed. In one illustrative embodiment, the system includes a broadband illumination source. In one illustrative embodiment, the broadband light source includes a rotatable gas containment structure for containing a gas; a rotational drive system configured to rotate the rotatable gas containment structure about an axis; a pump source configured to generate pump illumination; and a reflector element configured to direct a portion of the pump illumination into the gas to sustain a plasma, wherein the reflector is configured to collect at least a portion of broadband light emitted from the plasma. In another illustrative embodiment, the system includes a set of illumination optics configured to direct broadband light from the broadband illumination source to one or more samples. In another illustrative embodiment, the system includes a set of collection optics configured to collect light emanating from the one or more samples. In another illustrative embodiment, the system includes a detector assembly.

A method of generating broadband light is disclosed. In one illustrative embodiment, the method includes rotating a rotatable gas containment structure about an axis. In another illustrative embodiment, the method includes generating pump illumination. In another illustrative embodiment, the method includes directing, with a reflector element, a portion of the pump illumination into a gas in the rotatable gas containment structure to sustain a plasma. In another illustrative embodiment, the method includes collecting a portion of broadband light emitted from the plasma with the reflector element and directing the portion of broadband light to one or more downstream applications.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 4A illustrates convective patterns within a vertical lamp configuration;

DETAILED DESCRIPTION OF THE INVENTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Figure 1:
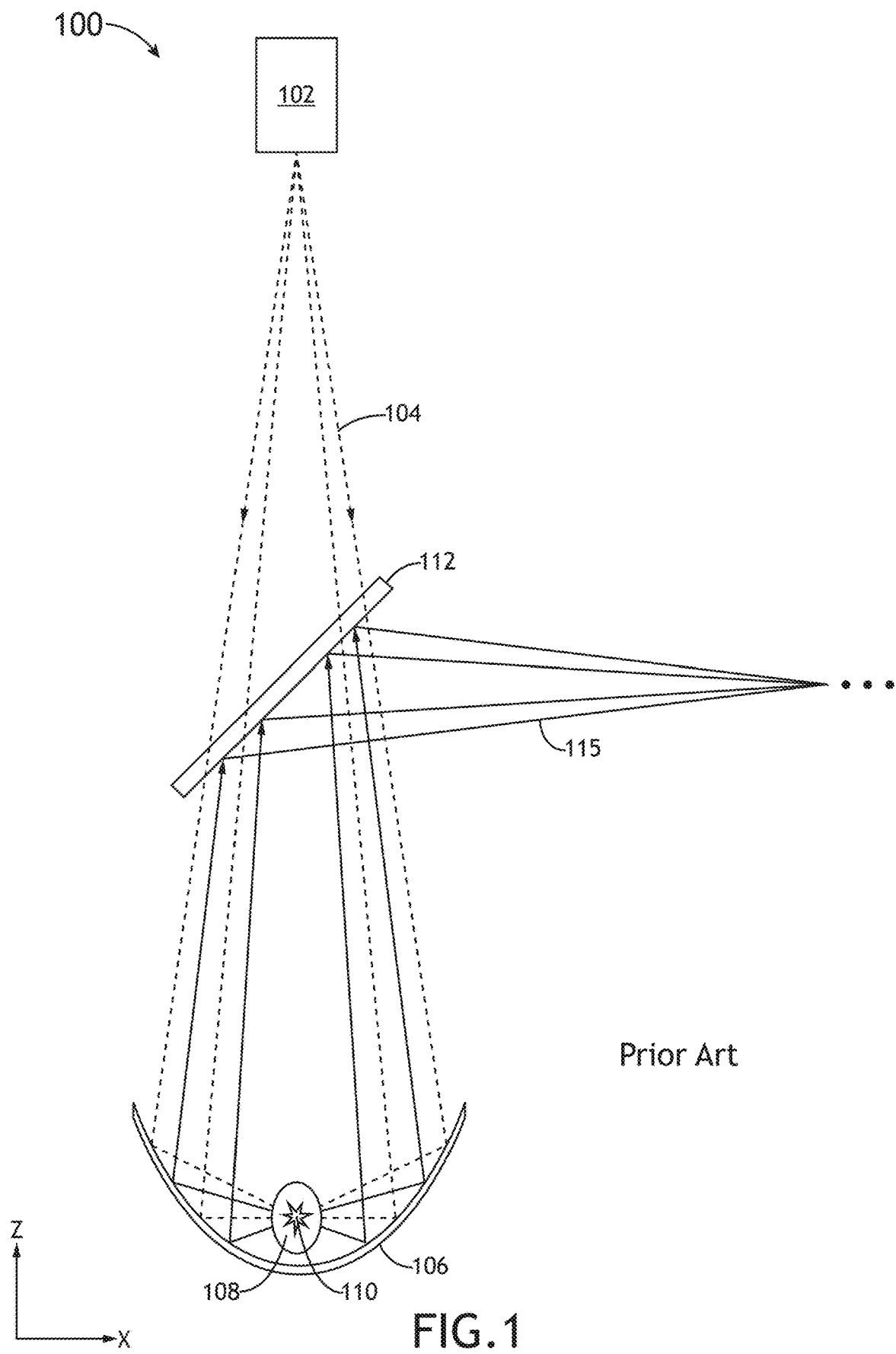
FIG. 1 is a schematic illustration of a conventional LSP broadband light source.
Figure 2C:
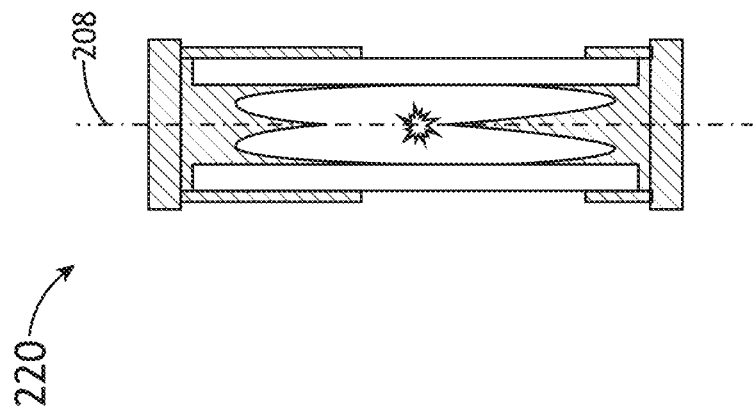
FIGS. 2A-2C illustrate simplified schematic views of gas containments structures.
Figure 2B:
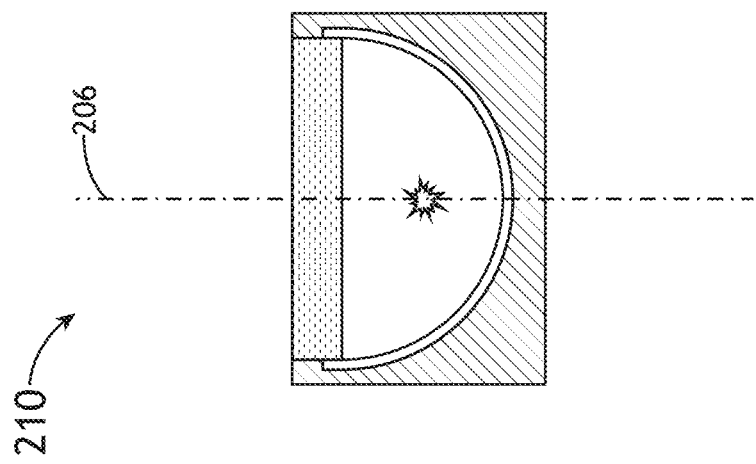
Figure 2A:
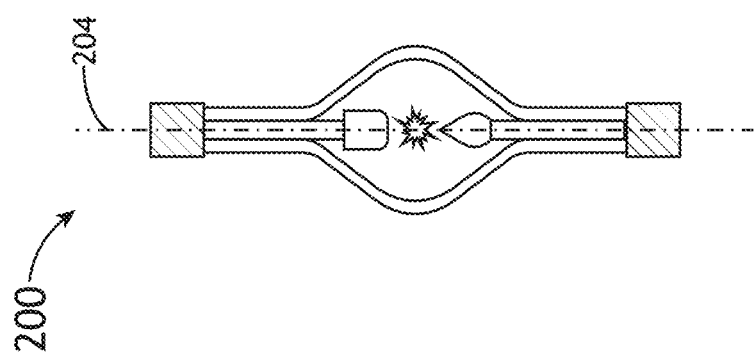

FIG. 1 is a schematic illustration of a conventional LSP broadband light source 100. The broadband light source 100 includes a pump source 102 configured to generate pump illumination 104 and an elliptical reflector element 106 configured to direct a portion of the pump illumination 104 to a gas contained in gas containment structure 108 to ignite and/or sustain a plasma 110. The elliptical reflector element 106 is configured to collect a portion of broadband light 115 emitted from the plasma 110. The broadband light 115 emitted from the plasma 110 may be collected via one or more additional optics (e.g., a cold mirror 112) for one or more downstream applications (e.g., inspection, metrology, or lithography). As shown in FIGS. 2A-2C, the gas containment structure 108 may include a plasma bulb (or lamp) 200, a plasma chamber 210, or a plasma cell 220. The gas containment structure 108 may display rotational symmetry as depicted by the vertical axis 204, 206, and 208 shown respectively in the bulb 200, chamber 210, and cell 220 of FIGS. 2A-2C.

Figure 3:
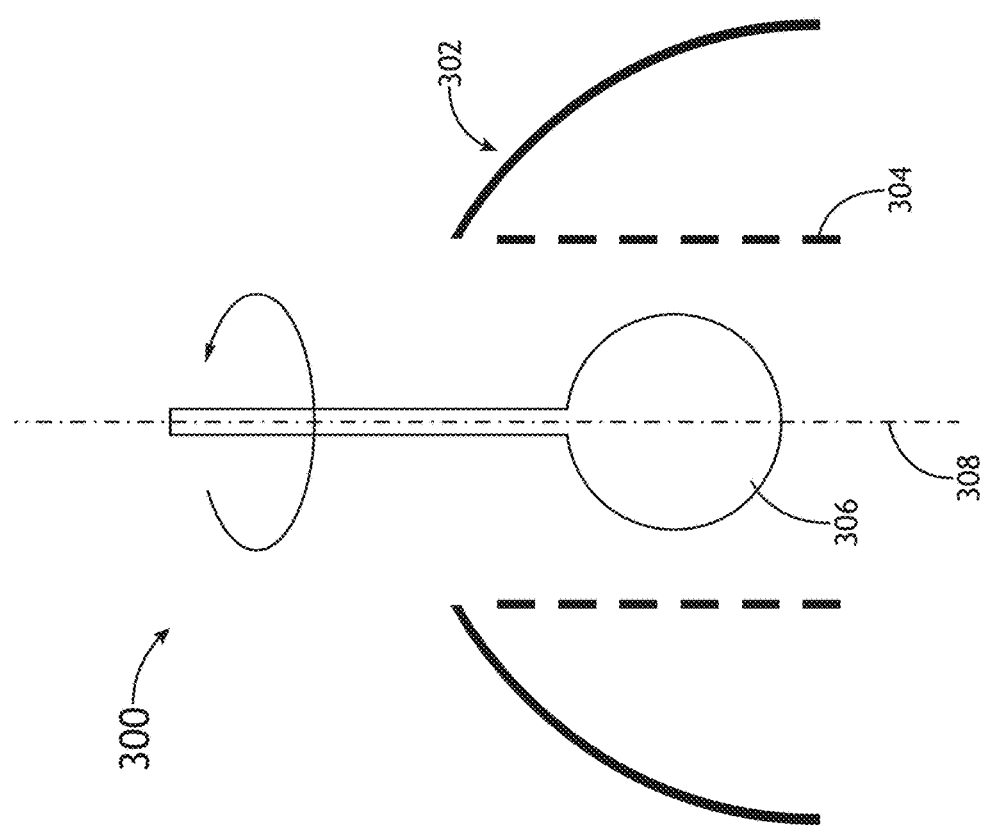
FIG. 3 illustrates a simplified schematic views of a sulfur lamp.

The generation of a light-sustained plasma is also generally described in U.S. Pat. No. 7,435,982, issued on Oct. 14, 2008, which is incorporated by reference herein in the entirety. The generation of plasma is also generally described in U.S. Pat. No. 7,786,455, issued on Aug. 31, 2010, which is incorporated by reference herein in the entirety. The generation of plasma is also generally described in U.S. Pat. No. 7,989,786, issued on Aug. 2, 2011, which is incorporated by reference herein in the entirety. The generation of plasma is also generally described in U.S. Pat. No. 8,182,127, issued on May 22, 2012, which is incorporated by reference herein in the entirety. The generation of plasma is also generally described in U.S. Pat. No. 8,309,943, issued on Nov. 13, 2012, which is incorporated by reference herein in the entirety. The generation of plasma is also generally described in U.S. Pat. No. 8,525,138, issued on Feb. 9, 2013, which is incorporated by reference herein in the entirety. The generation of plasma is also generally described in U.S. Pat. No. 8,921,814, issued on Dec. 30, 2014, which is incorporated by reference herein in the entirety. The generation of plasma is also generally described in U.S. Pat. No. 9,318,311, issued on Apr. 19, 2016, which is incorporated by reference herein in the entirety. The generation of plasma is also generally described in U.S. Pat. No. 9,390,902, issued on Jul. 12, 2016, which is incorporated by reference herein in the entirety. In a general sense, the various embodiments of the present disclosure should be interpreted to extend to any plasma-based light source known in the art. An optical system used in the context of plasma generation is described generally in U.S. Pat. No. 7,705,331, issued on Apr. 27, 2010, which is incorporated herein by reference in the entirety FIG. 3 illustrates a simplified schematic view of a sulfur lamp 300. Sulfur lamps are used as light sources and include a gas-filled lamp 306. The gas is heated by a microwave discharge from a microwave emitter 304, which drives sulphur chemical reactions within the gas resulting in light emission. The emitted light may be collected by a light collector 302. The light source is volumetric, and the lamp is configured to contain the discharge. It is noted that that rotation of the lamp aids in cooling of the lamp and confines the volumetric discharge near the center of the lamp. Note that the axis of rotation, depicted by the line 308, is vertical and provides symmetry relative to the gravity vector.

The microwave discharge in the sulphur lamp 300 is not suitable for use in most BBP applications based on low brightness of the light source compared to LSP sources (many orders of magnitude brighter, especially, in UV spectral range). However, LSP lamp operation suffers from an uneven thermal distribution on the glass of the lamp and convection-induced noise. The uneven thermal regime is caused by a very hot gas convective plume that rises from the plasma region and impinges on the top electrode or glass. The plume temperatures are on the order of a few thousand Kelvin and the plume diameter is approximate 2-4 mm. When contacting the glass bulb wall, this hot plasma plume causes localized heating of the glass. Uneven temperature distribution on the lamp walls causes accelerated lamp damage and requires complicated designs of lamp cooling. A microwave lamp is generally described in U.S. Pat. No. 5,866,990, issued on Feb. 2, 1999, which is incorporated herein by reference in the entirety.

Figure 4B:
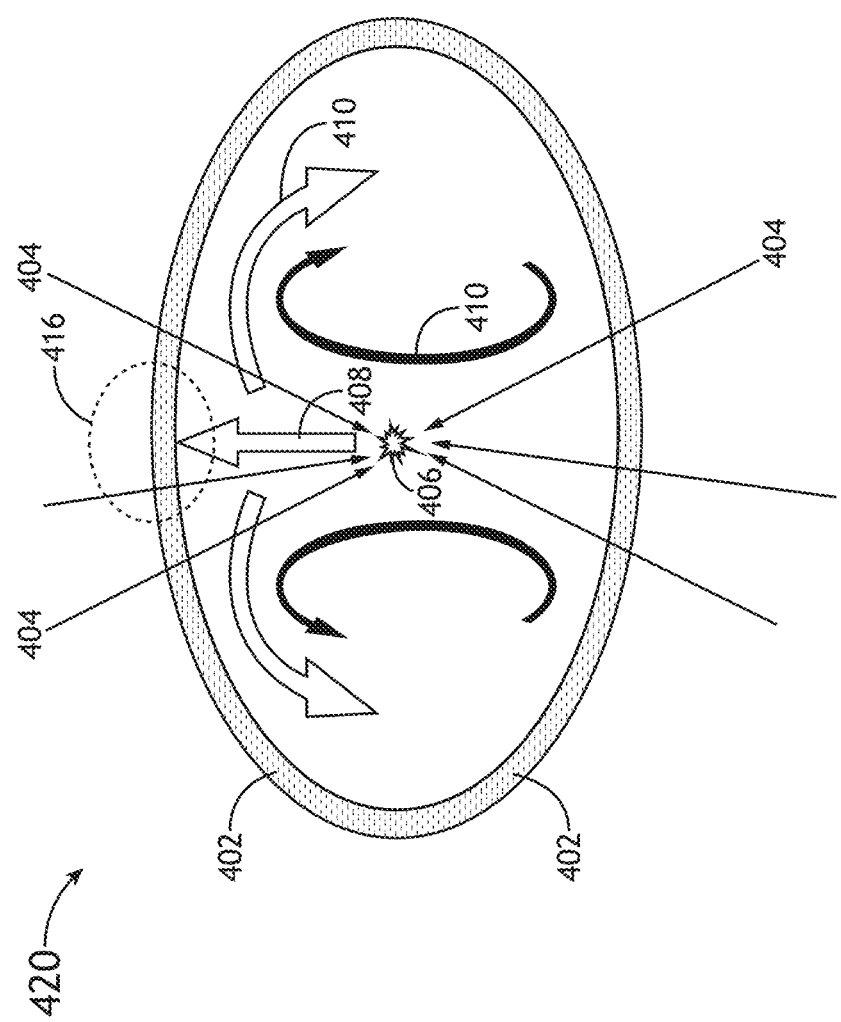
FIG. 4B illustrates convective patterns within a horizontal lamp configuration.

FIG. 4A illustrates convective patterns 410 within a vertical lamp 400 configuration. FIG. 4B illustrates convective patterns within a horizontal lamp 420 configuration. The lamps 400, 420 include a transparent bulb 402, which is transparent to pump illumination 404 used to sustain plasma 406. It is noted that hot plasma plume 408 induces convective patterns 410 inside the lamps 400, 420 cause degraded lamp performance. When the pump laser beam passes through a gas of varying temperature, variation in the index of refraction cause the laser rays to deflect resulting in degraded focusing (LSP often requires tight focusing to a spot of 100 μm). Areas 416 of the lamps 400, 420 may experience strong local heating by the plasma plume. The temperature variation in the convection patterns set by plasma plume can reach thousands of degrees. These convective patterns are also subject to fluctuations, causing the laser to focus differently at different instances in time. This leads to noise in laser focusing and, consequently, to noise in plasma light output Based on the shortcomings of source 100, embodiments of the present disclosure are directed to a broadband plasma (BBP) light source equipped with a rotating rotatable gas containment structure. When the rotatable gas containment structure is rotated at sufficient speed (e.g., 10-20,000 RPM) about the horizontal axis (or near-horizontal axis), the convective plume within the rotatable gas containment structure may be suppressed or eliminated. The suppression of the convective plume leads to a rotationally uniform heating distribution across the walls of the rotatable gas containment structure, while the instabilities associated with laser refraction caused by the convective plume are also eliminated. The implementation of the rotating gas containment structure of the present disclosure may also allow for simplified lamp cooling configurations.

Figure 5A:
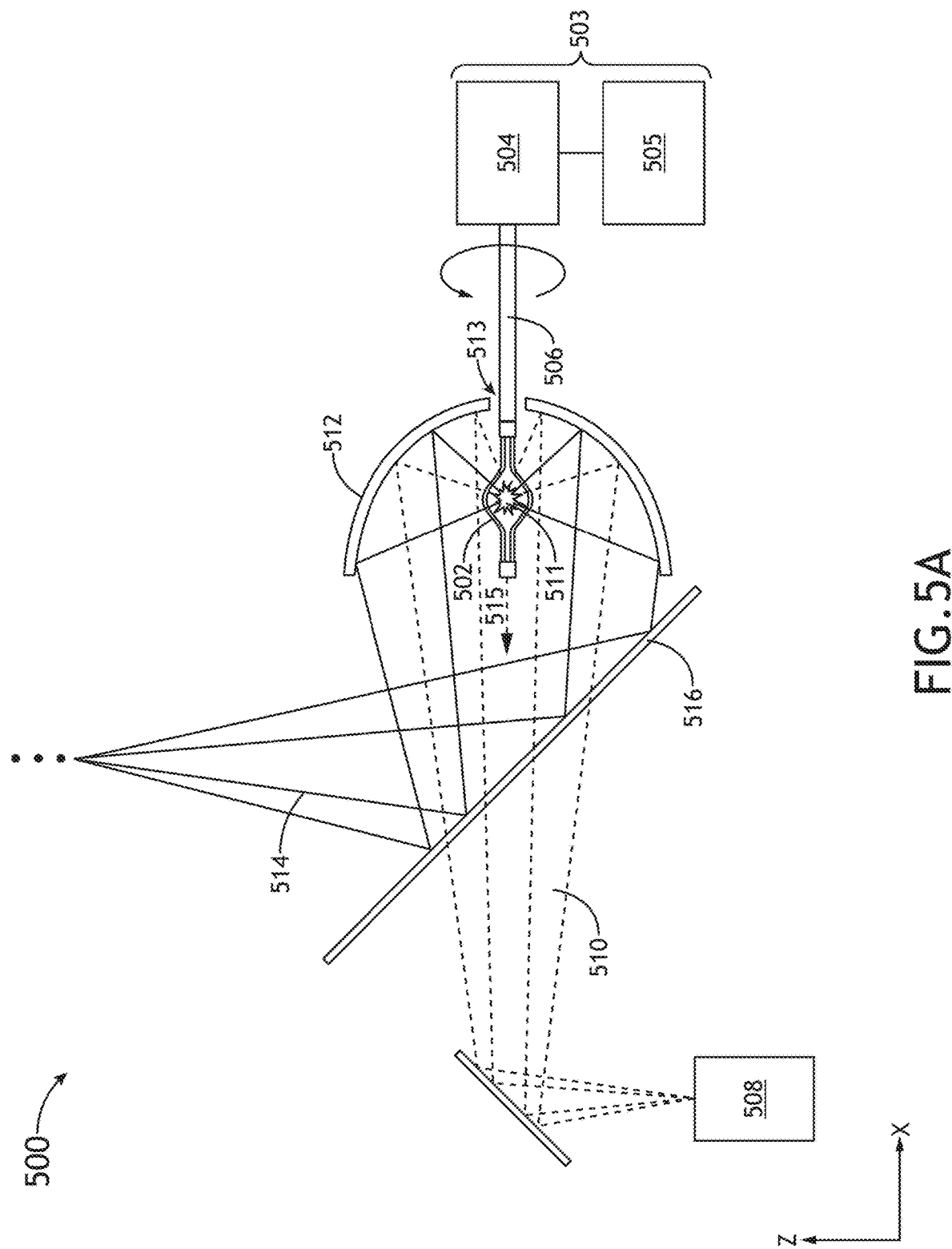
FIG. 5A is a schematic illustration a laser-sustained broadband plasma light source with a rotating plasma bulb as a gas containment structure, in accordance with one or more embodiments of the present disclosure.

FIG. 5A illustrates a simplified schematic view of an LSP broadband light source 500 with a rotatable gas containment structure 502, in accordance with one or more embodiments of the present disclosure.

In embodiments, the broadband light source 500 includes a rotatable gas containment structure 502, a rotational drive system 503, a pump source 508, and a reflector element 512.

In embodiments, the rotatable gas containment structure 502 is oriented such that its vertical axis of symmetry 515 is oriented along the horizontal direction. For example, the rotatable gas containment structure 502 may be oriented such that its axis of symmetry 515 is oriented along the horizontal direction defined by the x-axis in FIG. 5A. In this embodiment, the 'horizontal direction' should be interpreted as the direction generally horizontal to the Earth's surface or perpendicular to the direction of the gravitational field. It is noted herein that deviations from true horizonal directions should not be interpreted as departing from the scope of the present disclosure. For example, the rotatable gas containment structure 502 may be oriented such that its axis of symmetry 515 is oriented along a near-horizontal direction. For the purposes of this disclosure, 'near-horizonal' may be interpreted as any direction within ±45 degrees of the true horizonal direction. In embodiments, in order to accommodate the horizontal orientation of the rotatable gas containment structure 502, the reflector element 512 is oriented such that a reflective surface of the reflector element is centered generally along the horizontal direction and oriented to receive the pump illumination from the pump source 508.

The rotational drive system 503 may be rotationally coupled to the rotatable gas containment structure 502. For example, the rotational drive system 503 may include a motor 504 and a drive shaft 506. The drive shaft 506 may be mechanically coupled to the rotatable gas containment structure 502 so to transfer rotational energy from the motor 504 to the rotatable gas containment structure 502, thereby causing the rotatable gas containment structure 502 to rotate about a selected axis 515. In embodiments, the rotational drive system 503 may include a drive or controller 505. The drive/controller 505 may be configured to control the motor output (e.g., via one or more control signals), thereby controlling the rotational speed and acceleration of the rotatable gas containment structure 502. The drive/controller 505 may include one or more processors and memory configured for programming a rotational acceleration and speed profile to be applied to the motor and gas containment structure 502. Alternatively, the drive/controller 505 may allow for the manual control of the motor and rotational speed of the gas containment structure 502.

In embodiments, the rotational drive system 503 is configured to rotate the rotatable gas containment structure 502 at a rotational speed sufficient to suppress convective patterns within the gas containment structure 502. For example, the rotational drive system 503 may rotate the rotatable gas containment structure 502 at a rotational speed between 10 and 20,000 RPM. By way of further example, the rotational drive system 503 may rotate the rotatable gas containment structure 502 at a rotational speed at or above 1000 RPM. By way of further example, the rotational drive system 503 may rotate the rotatable gas containment structure 502 at a rotational speed between 1000 and 8000 RPM. By way of further example, the rotational drive system 503 may rotate the rotatable gas containment structure 502 at a rotational speed between 10 and 600 RPM.

It is noted that rotating the rotatable gas containment structure 502 at low rotation speeds (e.g., 10-600 RPM), may result in more uniform heating of the containment structure 502 by the plume originated from the plasma 511 producing rotationally symmetric temperature distributions of the containment structure 502. In this manner, at low rotation speeds the plume from the plasma 511 rises to the wall of the gas containment structure 502, but as the wall of gas containment structure 502 rotates the plume acts to uniformly heat the wall. Further, rotating the rotatable gas containment structure 502 at sufficiently high rotation speeds (e.g., 1000-8000 RPM, or above 8000 pm) the plasma plume associated with the plasma 511 may be eliminated entirely, thereby removing heating of containment structure 502 by the hot gas of the plume. In addition, rotating the rotatable gas containment structure 502 at sufficiently high rotation speeds may result in producing a rotationally symmetric temperature/heating distribution in the plasma, and allowing plasma lamps to operate at in a preferred thermal range. Rotationally symmetric heating distributions reduce damage caused to the glass of the wall, which may occur at excessively high temperature. Further, the elimination or suppression of asymmetric convective patterns within the gas containment structure 502 may eliminate or suppress instabilities related to laser refraction, which leads to improved focus stability of the pump illumination (e.g., pump laser) and, consequently, better LSP performance and reduced noise.

In addition, the rotation of the gas containment structure 502 simplifies cooling arrangements for the gas containment structure 502. For example, instead of implementing aggressive cooling of the hottest areas of a glass surface of the gas containment structure 502, where the plume touches the glass of the gas containment structure 502, the rotating gas containment structure 502 of the present disclosure allows for more uniform cooling approaches. The rotation of the gas containment structure 502 helps establish rotationally symmetric cooling approaches. Even further, at high speeds (e.g., above 1000 RMP), cooling of the gas containment structure 502 may take place even without forced external cooling mechanisms in place.

In embodiments, the broadband light source 500 includes one or more pump sources 508 for generating one or more beams of pump illumination 510. The one or more pump sources 508 may include any pump source known in the art suitable for igniting and/or sustaining plasma. For example, the one or more pump sources 508 may include one or more lasers (i.e., pump lasers). The pump beam may include radiation of any wavelength or wavelength range known in the art including, but not limited to, visible, IR radiation, NIR radiation, and/or UV radiation.

In embodiments, the broadband light source 500 includes an open access hole 513 configured to allow insertion of a gas containment structure 502, such as plasma cell or plasma bulb. For example, the rotatable gas containment structure 502 of the light source 500 may include an open access hole 513.

The rotatable gas containment structure 502 may include any gas containment structure known in the art. For example, as shown in FIG. 5A, the gas containment structure 502 may be a plasma bulb (i.e., plasma lamb). The use of a plasma bulb is described in at least in U.S. Pat. No. 7,786, 455, issued on Aug. 31, 2010; U.S. Pat. No. 7,435,982, issued on Oct. 14, 2008; and U.S. Pat. No. 9,318,311, issued on Apr. 19, 2016, which are each incorporated previously herein by reference in their entirety. It is noted herein that, in the case where the rotatable gas containment structure 502 is a plasma bulb or a plasma cell, the transparent portions (e.g., glass) of the rotatable gas containment structure 502 may take on any number of shapes. For example, the rotatable gas containment structure 502 may have a cylindrical shape, a spherical shape, a cardioid shape, or the like.

Figure 5B:
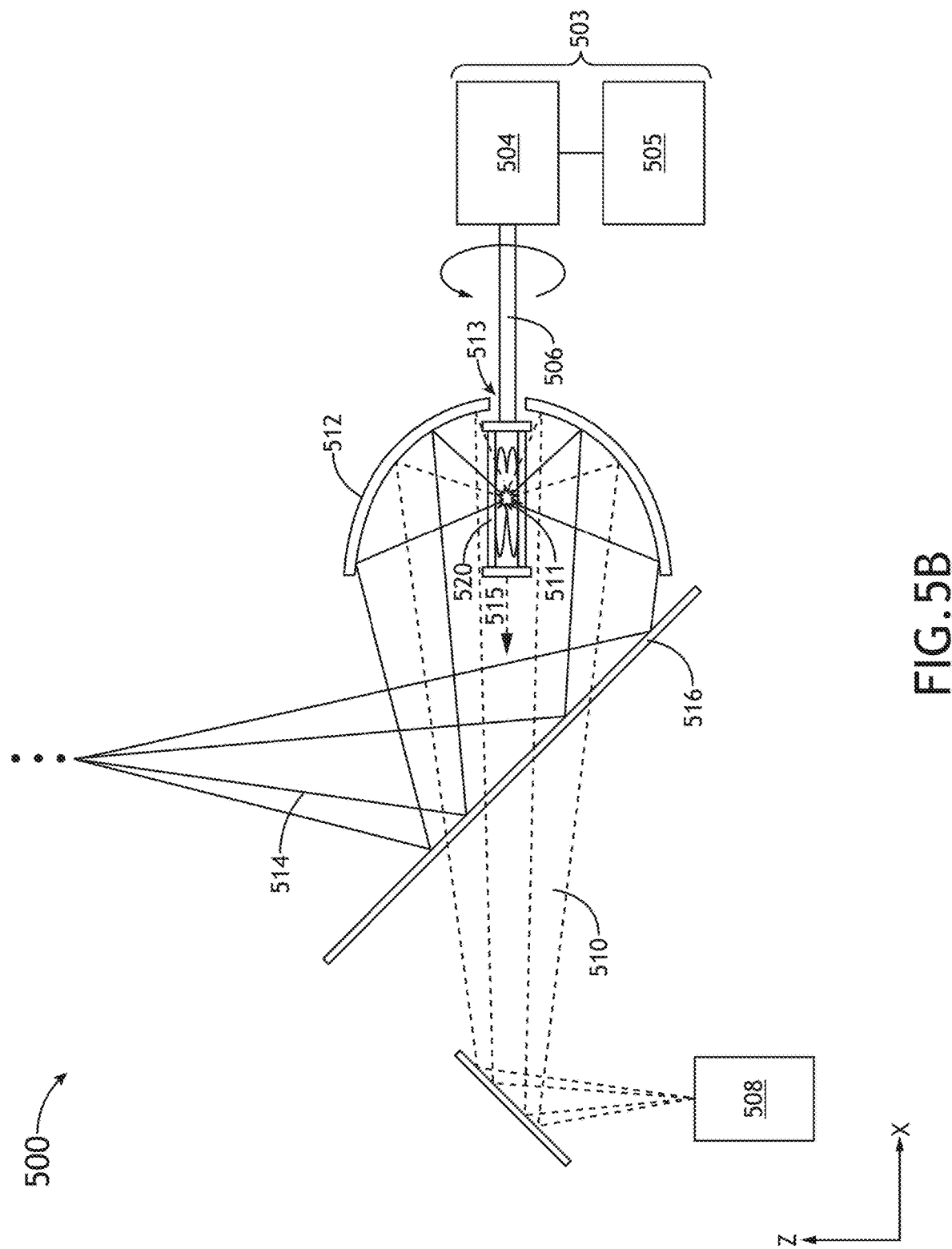
FIG. 5B is a schematic illustration a laser-sustained broadband plasma light source with a rotating plasma cell as a gas containment structure, in accordance with one or more embodiments of the present disclosure.
Figure 5C:
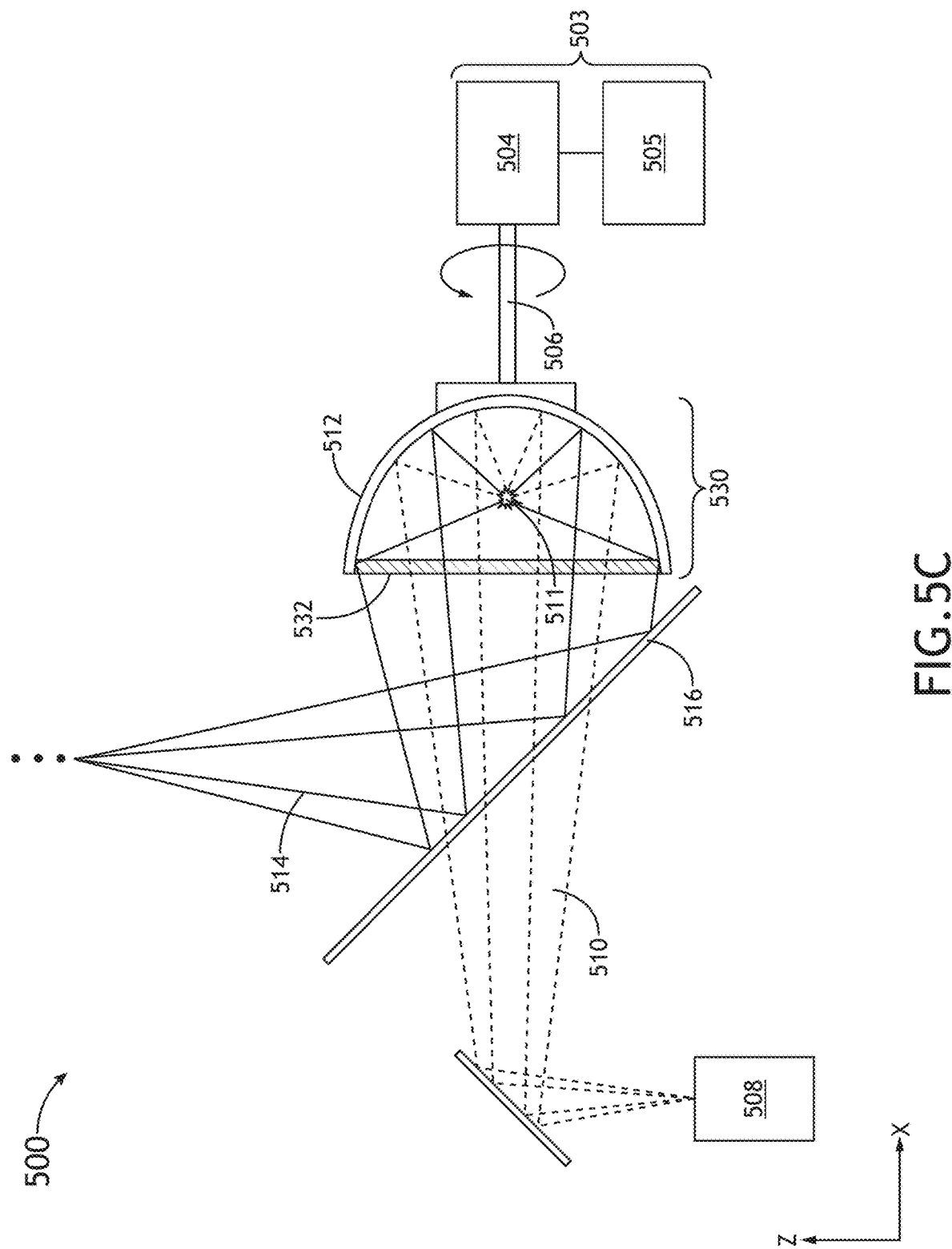
FIG. 5C is a schematic illustration a laser-sustained broadband plasma light source with a rotating plasma chamber as a gas containment structure, in accordance with one or more embodiments of the present disclosure.

FIG. 5B illustrates a schematic view of the LSP broadband light source 500 equipped with a plasma cell as a gas containment structure, in accordance with one or more additional and/or alternative embodiments of the present disclosure. In this embodiment, the plasma bulb as shown in FIG. 5A has been replaced with the plasma cell 520. It is noted that the embodiments described previously herein with respect to FIG. 5A should be interpreted to extend to the embodiment of FIG. 5B unless otherwise noted. In the case of a plasma cell, the plasma cell may include, but is not limited to, a transmission element arranged in combination with one or more flanges for containing the gas for producing the plasma 511. The use of a flanged plasma cell is described in at least U.S. Pat. No. 9,775,226, issued on Sep. 26, 2017; and U.S. Pat. No. 9,185,788, issued on Nov. 10, 2015, which are each incorporated previously herein by reference in the entirety FIG. 5C illustrates a schematic view of the LSP broadband light source 500 equipped with a plasma cell as a gas containment structure, in accordance with one or more additional and/or alternative embodiments of the present disclosure. In this embodiment, the plasma bulb as shown in FIG. 5A has been replaced with the plasma chamber 530. It is noted that the embodiments described previously herein with respect to FIGS. 5A and 5B should be interpreted to extend to the embodiment of FIG. 5C unless otherwise noted. The use of a gas chamber as a gas containment structure is described in U.S. Pat. No. 9,099,292, issued on Aug. 4, 2015; U.S. Pat. No. 9,263,238, issued on Feb. 16, 2016; U.S. Pat. No. 9,390,902, issued on Jul. 12, 2016, which are each incorporated herein by reference in their entirety.

In this embodiment, the reflector element 512 may be configured to form the rotatable gas containment structure 502 itself. For example, the reflector element 512 may be sealed so to contain the gas within the volume defined by the surfaces of the reflector element 512. In this example, an internal gas containment structure, such as plasma cell or plasma bulb is not needed, with the surfaces of the reflector element 512 and one or more windows 532 forming the gas chamber 530. In this case, the opening of the reflector element 512 may be sealed with the window 532 (e.g., glass window) to allow both the pump illumination 510 and plasma broadband light 514 to pass through it.

Referring generally to FIGS. 5A-5C, the pump source 508 may include any laser system known in the art. For instance, the pump source 508 may include any laser system known in the art capable of emitting radiation in the infrared, visible and/or ultraviolet portions of the electromagnetic spectrum.

In embodiments, the pump source 508 may include a laser system configured to emit continuous wave (CW) laser radiation. For example, the pump source 508 may include one or more CW infrared laser sources. In embodiments, the pump source 508 may include one or more lasers configured to provide laser light at substantially a constant power to the plasma 511. In embodiments, the pump source 508 may include one or more modulated lasers configured to provide modulated laser light to the plasma 511. In embodiments, the pump source 508 may include one or more pulsed lasers configured to provide pulsed laser light to the plasma. In embodiments, the pump source 508 may include one or more diode lasers. For example, the pump source 508 may include one or more diode lasers emitting radiation at a wavelength corresponding with any one or more absorption lines of the species of the gas contained within the gas containment structure. A diode laser of pump source 508 may be selected for implementation such that the wavelength of the diode laser is tuned to any absorption line of any plasma (e.g., ionic transition line) or any absorption line of the plasma-producing gas (e.g., highly excited neutral transition line) known in the art. As such, the choice of a given diode laser (or set of diode lasers) will depend on the type of gas used in the light source 500. In embodiments, the pump source 508 may include an ion laser. For example, the pump source 508 may include any noble gas ion laser known in the art. For instance, in the case of an argon-based plasma, the pump source 508 used to pump argon ions may include an Ar+ laser. In embodiments, the pump source 508 may include one or more frequency converted laser systems. In embodiments, the pump source 508 may include a disk laser. In embodiments, the pump source 508 may include a fiber laser. In embodiments, the pump source 508 may include a broadband laser. In embodiments, the pump source 508 may include one or more non-laser sources. The pump source 508 may include any non-laser light source known in the art. For instance, the pump source 508 may include any non-laser system known in the art capable of emitting radiation discretely or continuously in the infrared, visible or ultraviolet portions of the electromagnetic spectrum.

In embodiments, the pump source 508 may include two or more light sources. In embodiments, the pump source 508 may include two or more lasers. For example, the pump source 508 (or "sources") may include multiple diode lasers. In embodiments, each of the two or more lasers may emit laser radiation tuned to a different absorption line of the gas or plasma within source 500.

In embodiments, the broadband light source 500 includes a reflector element 512 configured to focus a portion of the pump illumination 510 into a gas contained within the rotatable gas containment structure 502 at the focus of the reflector element 512 to ignite and/or sustain a plasma 511. The reflector element 512 may include any reflector elements known in the art of plasma production. In embodiments, the reflector element 512 may include a reflective ellipsoid section (i.e., an elliptical reflector). It is noted herein that the reflector element 512 elements 214 is not limited to an elliptical reflector. Rather, the reflector element 512 may include any reflector shape known in the art of plasma production. For example, the reflector element 512 may include one or more elliptical reflectors, one or more spherical reflectors, and/or one or more parabolic reflectors. The reflector element 512 may be configured to collect any wavelength of broadband light from the plasma 511 known in the art of plasma-based broadband light sources. For example, the reflector element 512 may be configured to collect ultraviolet (UV) light, near ultraviolet (NUV), vacuum UV (VUV) light, and/or deep UV (DUV) light from the plasma 511.

The transmitting portion of the gas containment structure of source 500 (e.g., transmission element, bulb or window) may be formed from any material known in the art that is at least partially transparent to the broadband light 514 generated by plasma 511 and/or the pump illumination 510. In embodiments, one or more transmitting portions of the gas containment structure (e.g., transmission element, bulb or window) may be formed from any material known in the art that is at least partially transparent to VUV radiation, DUV radiation, UV radiation, NUV radiation and/or visible light generated within the gas containment structure. Further, one or more transmitting portions of the gas containment structure may be formed from any material known in the art that is at least partially transparent to IR radiation, visible light and/or UV light from the pump source 508. In embodiments, one or more transmitting portions of the gas containment structure may be formed from any material known in the art transparent to both radiation from the pump source 508 (e.g., IR source) and radiation (e.g., VUV, DUV, UV, NUV radiation and/or visible light) emitted by the plasma 511.

The gas containment structure 502 may contain any selected gas (e.g., argon, xenon, mercury or the like) known in the art suitable for generating a plasma upon absorption of pump illumination. In embodiments, the focusing of pump illumination 510 from the pump source 508 into the volume of gas causes energy to be absorbed by the gas or plasma (e.g., through one or more selected absorption lines) within the gas containment structure, thereby "pumping" the gas species in order to generate and/or sustain a plasma 511. In embodiments, although not shown, the gas containment structure may include a set of electrodes for initiating the plasma 511 within the internal volume of the gas containment structure 502, whereby the illumination from the pump source 508 maintains the plasma 511 after ignition by the electrodes The source 500 may be utilized to initiate and/or sustain the plasma 511 in a variety of gas environments. In embodiments, the gas used to initiate and/or maintain plasma 511 may include an inert gas (e.g., noble gas or non-noble gas) or a non-inert gas (e.g., mercury). In embodiments, the gas used to initiate and/or maintain a plasma 511 may include a mixture of gases (e.g., mixture of inert gases, mixture of inert gas with non-inert gas or a mixture of non-inert gases). For example, gases suitable for implementation in source 500 may include, but are not limited, to Xe, Ar, Ne, Kr, He, $N_2$, $H_2O$, $O_2$, $H_2$, $D_2$, $F_2$, $CH_4$, one or more metal halides, a halogen, Hg, Cd, Zn, Sn, Ga, Fe, Li, Na, Ar:Xe, ArHg, KrHg, XeHg, and any mixture thereof. The present disclosure should be interpreted to extend to any gas suitable for sustaining a plasma within a gas containment structure.

In embodiments, the broadband light source 500 further includes one or more additional optics configured to direct the broadband light 514 from the plasma 511 to one or more downstream applications (indicated by the ellipsis in FIGS. 5A-5C). The one or more additional optics may include any optical element known in the art including, but not limited to, one or more mirrors, one or more lenses, one or more filters, one or more beam splitters, or the like. For example, as shown in FIGS. 5A-5C, the one or more additional optics may include, but are not limited to, a cold mirror 516. The reflector element 512 may collect one or more of visible, NUV, UV, DUV, and/or VUV radiation emitted by plasma 511 and direct the broadband light 514 to one or more downstream optical elements. For example, the reflector element 512 may deliver visible, NUV, UV, DUV, and/or VUV radiation to downstream optical elements of any optical characterization system known in the art, such as, but not limited to, an inspection tool, a metrology tool, or a lithography tool. In this regard, the broadband light 514 may be coupled to the illumination optics of an inspection tool, metrology tool, or lithography tool.

Figure 6A:
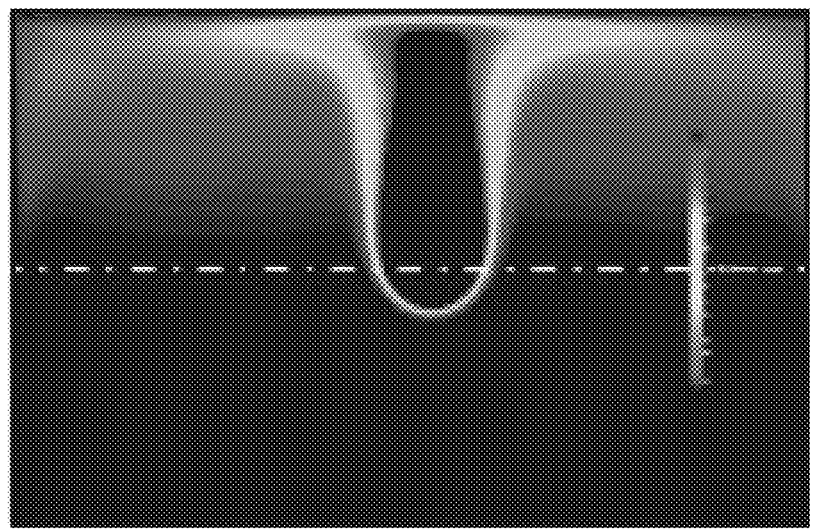
FIGS. 6A-6C illustrate the process occurring with the plasma plume of the plasma as a function of rotation speed of the gas containment structure, in accordance with one or more embodiments of the present disclosure.
Figure 6A:
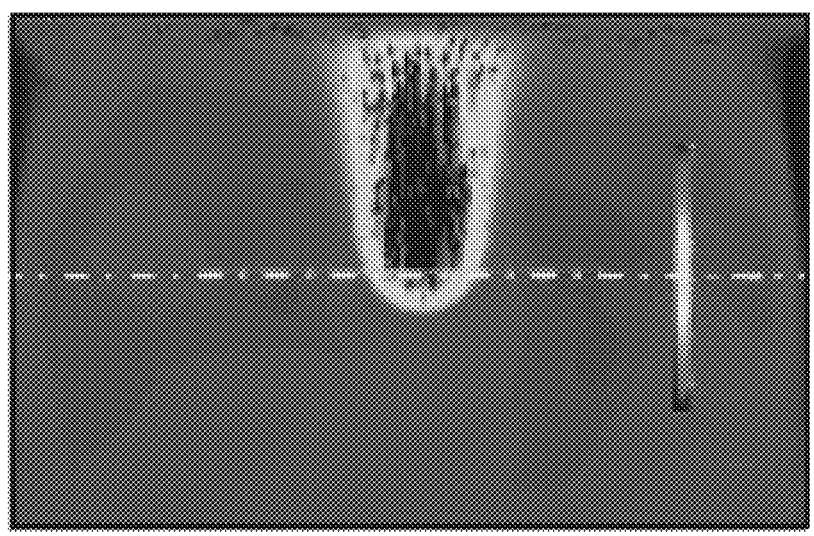
Figure 6B:
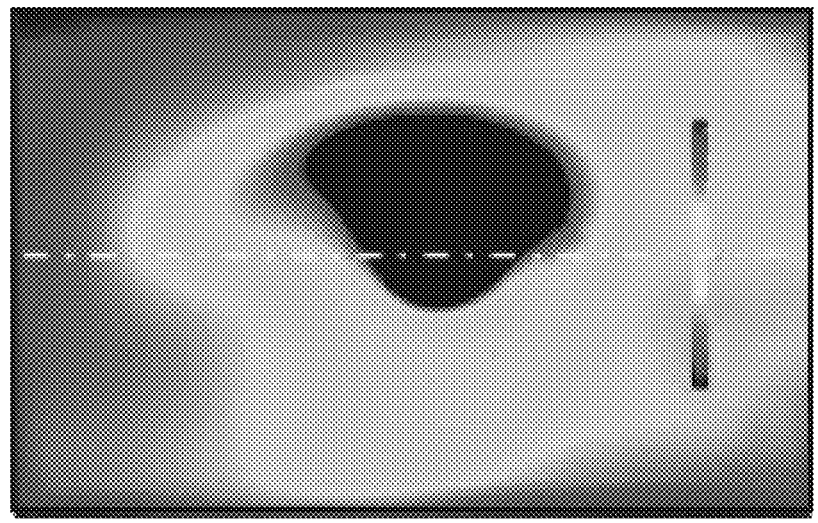
Figure 6B:
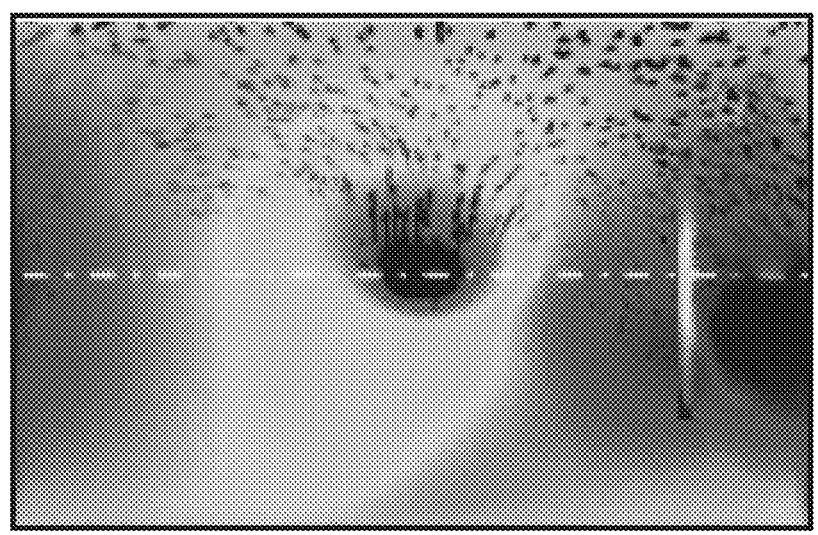
Figure 6C:
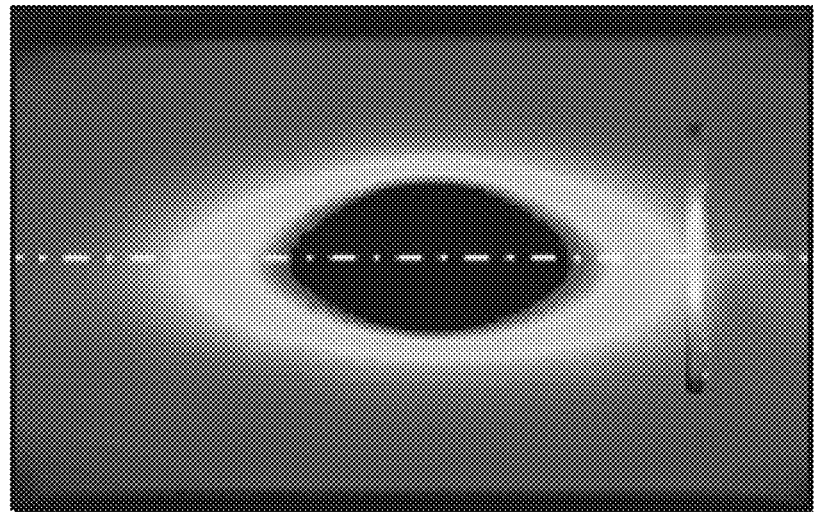
Figure 6C:
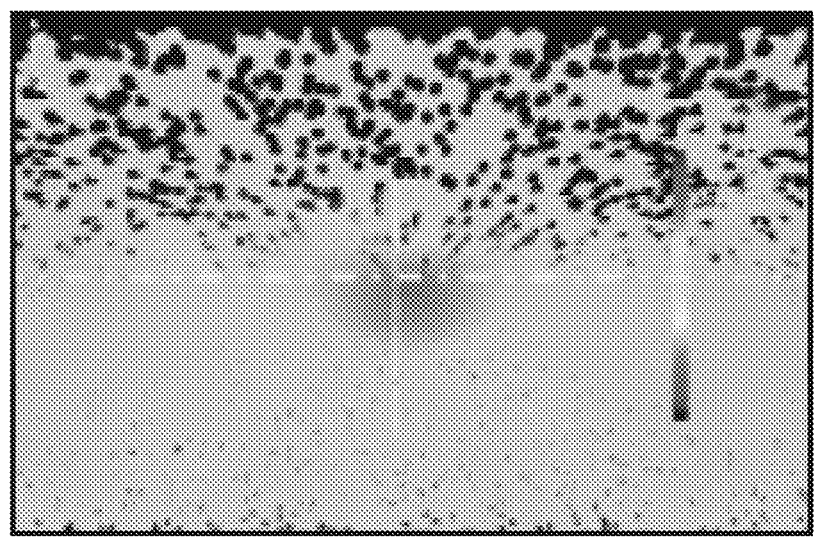

FIGS. 6A-6C illustrate the process occurring with the plasma plume of the plasma 511 as a function of rotation speed of the gas containment structure 502, in accordance with one or more embodiments of the present disclosure. It is noted that the simulations depicted in FIGS. 6A-6C were performed in a cylindrical geometry with the diameter of the bulb/lamp of 16 mm. FIGS. 6A-6C depict the temperature and velocity distributions of the plasma/gas within a gas containment structure simulated at 0, 1200, and 1600 RPM respectively. The horizontal dotted line represents the axis of rotation of the gas containment structure. As shown in FIG. 6A, in the absence of rotation (0 RPM), a hot plasma plume (truncated at 5000K in the figure) contacts the top part of the glass wall (i.e., the top edge of the image in FIG. 6A) of the gas containment structure with the flow velocities of about 1 m/s causing significant localized heating. In this case, the pump laser light focused through the plume exhibits strong refraction. As shown in FIG. 6B, as the rotational speed increases to 1200 RM, the plume shrinks in the vertical direction and is stretched in the horizontal direction, and the temperature distribution becomes more rotationally symmetric. As shown in FIG. 6C, as the rotational speed increases to 6000 RPM, the plume is eliminated, and the temperature distribution becomes nearly rotationally symmetric.

Figure 7:
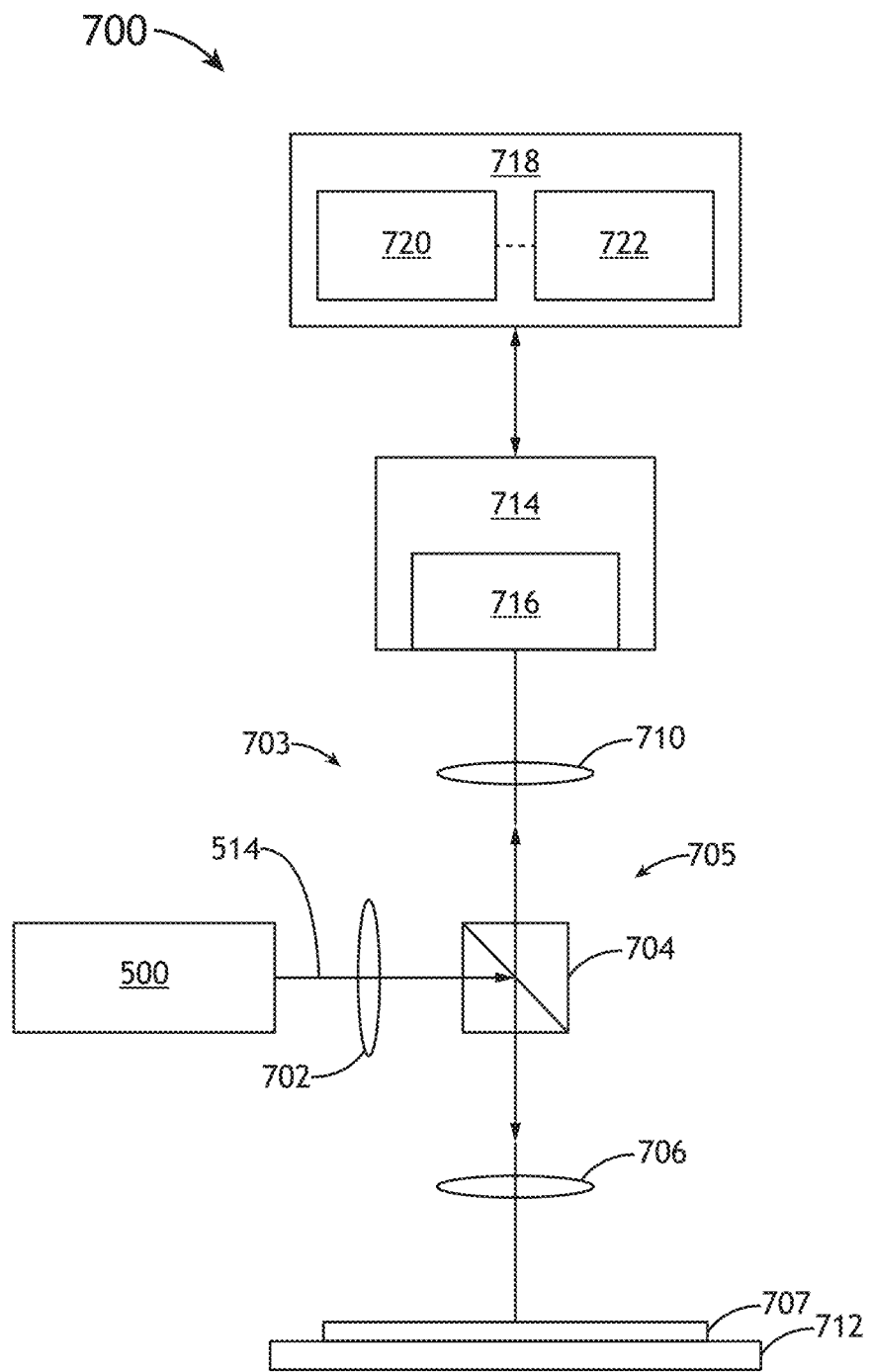
FIG. 7 is a simplified schematic illustration of an optical characterization system implementing an the LSP broadband light source illustrated in any of FIGS. 5A through 5C, in accordance with one or more embodiments of the present disclosure.

FIG. 7 is a schematic illustration of an optical characterization system 700 implementing the LSP broadband light source 500 illustrated in any of FIGS. 5A through 5C (or any combination thereof), in accordance with one or more embodiments of the present disclosure.

It is noted herein that system 700 may comprise any imaging, inspection, metrology, lithography, or other characterization/fabrication system known in the art. In this regard, system 700 may be configured to perform inspection, optical metrology, lithography, and/or imaging on a sample 707. Sample 707 may include any sample known in the art including, but not limited to, a wafer, a reticle/photomask, and the like. It is noted that system 700 may incorporate one or more of the various embodiments of the LSP broadband light source 500 described throughout the present disclosure.

In embodiments, sample 707 is disposed on a stage assembly 712 to facilitate movement of sample 707. The stage assembly 712 may include any stage assembly 712 known in the art including, but not limited to, an X-Y stage, an R-θ stage, and the like. In embodiments, stage assembly 712 is capable of adjusting the height of sample 707 during inspection or imaging to maintain focus on the sample 707.

In embodiments, the set of illumination optics 703 is configured to direct illumination from the broadband light source 500 to the sample 707. The set of illumination optics 703 may include any number and type of optical components known in the art. In embodiments, the set of illumination optics 703 includes one or more optical elements such as, but not limited to, one or more lenses 702, a beam splitter 704, and an objective lens 706. In this regard, set of illumination optics 703 may be configured to focus illumination from the LSP broadband light source 500 onto the surface of the sample 707. The one or more optical elements may include any optical element or combination of optical elements known in the art including, but not limited to, one or more mirrors, one or more lenses, one or more polarizers, one or more gratings, one or more filters, one or more beam splitters, and the like.

In embodiments, the set of collection optics 705 is configured to collect light reflected, scattered, diffracted, and/or emitted from sample 707. In embodiments, the set of collection optics 705, such as, but not limited to, focusing lens 710, may direct and/or focus the light from the sample 707 to a sensor 716 of a detector assembly 714. It is noted that sensor 716 and detector assembly 714 may include any sensor and detector assembly known in the art. For example, the sensor 716 may include, but is not limited to, a charge-coupled device (CCD) detector, a complementary metal-oxide semiconductor (CMOS) detector, a time-delay integration (TDI) detector, a photomultiplier tube (PMT), an avalanche photodiode (APD), and the like. Further, sensor 716 may include, but is not limited to, a line sensor or an electron-bombarded line sensor.

In embodiments, detector assembly 714 is communicatively coupled to a controller 718 including one or more processors 720 and memory medium 722. For example, the one or more processors 720 may be communicatively coupled to memory 722, wherein the one or more processors 720 are configured to execute a set of program instructions stored on memory 722. In embodiments, the one or more processors 720 are configured to analyze the output of detector assembly 714. In embodiments, the set of program instructions are configured to cause the one or more processors 720 to analyze one or more characteristics of sample 707. In embodiments, the set of program instructions are configured to cause the one or more processors 720 to modify one or more characteristics of system 700 in order to maintain focus on the sample 707 and/or the sensor 716. For example, the one or more processors 720 may be configured to adjust the objective lens 706 or one or more optical elements 702 in order to focus illumination from LSP broadband light source 500 onto the surface of the sample 707. By way of another example, the one or more processors 720 may be configured to adjust the objective lens 706 and/or one or more optical elements 702 in order to collect illumination from the surface of the sample 707 and focus the collected illumination on the sensor 716.

It is noted that the system 700 may be configured in any optical configuration known in the art including, but not limited to, a dark-field configuration, a bright-field orientation, and the like.

Figure 8:
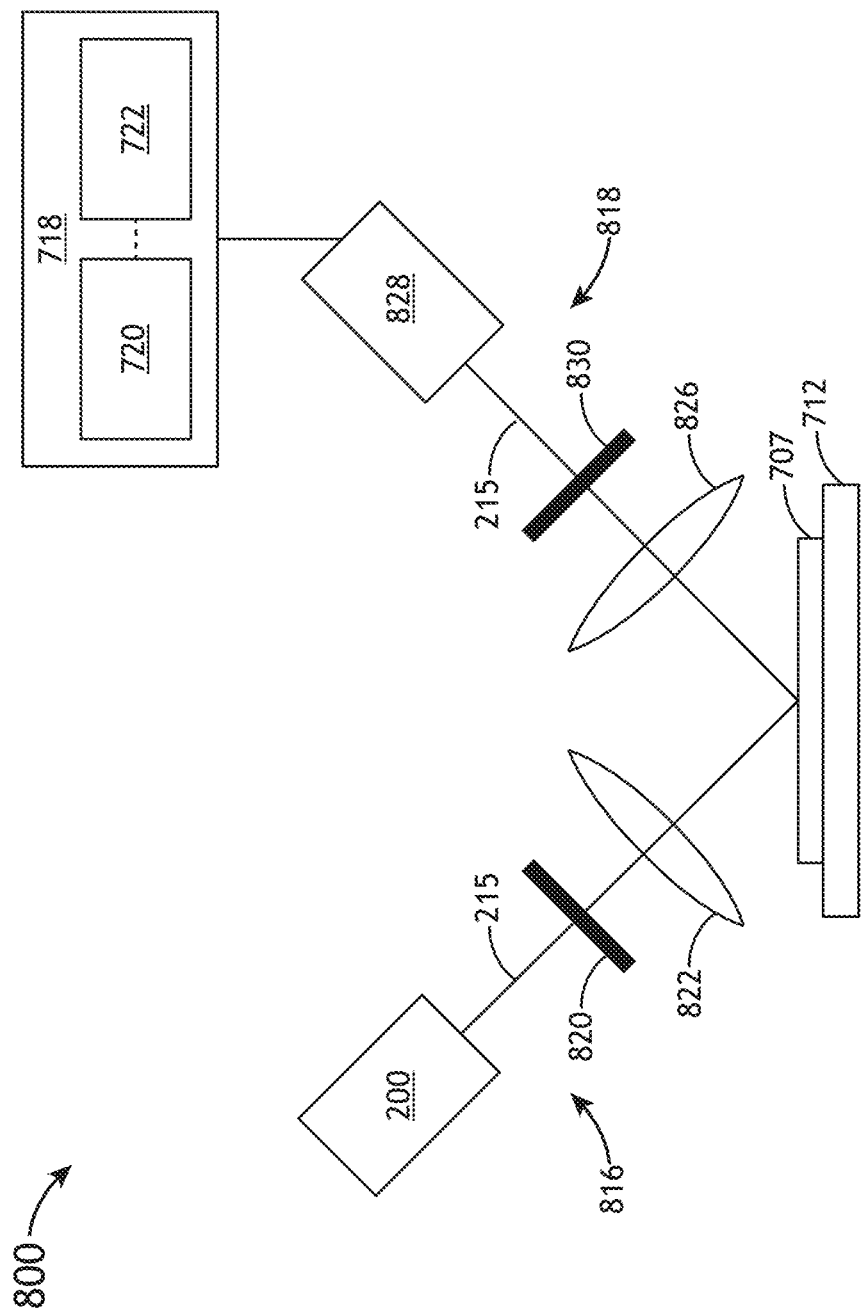
FIG. 8 illustrates a simplified schematic diagram of an optical characterization system arranged in a reflectometry and/or ellipsometry configuration, in accordance with one or more embodiments of the present disclosure.

FIG. 8 illustrates a simplified schematic diagram of an optical characterization system 800 arranged in a reflectometry and/or ellipsometry configuration, in accordance with one or more embodiments of the present disclosure. It is noted that the various embodiments and components described with respect to FIGS. 2A though 7 may be interpreted to extend to the system of FIG. 8. The system 800 may include any type of metrology system known in the art.

In embodiments, system 800 includes the LSP broadband light source 500, a set of illumination optics 816, a set of collection optics 818, a detector assembly 828, and the controller 718 including the one or more processors 720 and memory 722.

In this embodiment, the broadband illumination from the LSP broadband light source 500 is directed to the sample 707 via the set of illumination optics 816. In embodiments, the system 800 collects illumination emanating from the sample via the set of collection optics 818. The set of illumination optics 816 may include one or more beam conditioning components 820 suitable for modifying and/or conditioning the broadband beam. For example, the one or more beam conditioning components 820 may include, but are not limited to, one or more polarizers, one or more filters, one or more beam splitters, one or more diffusers, one or more homogenizers, one or more apodizers, one or more beam shapers, or one or more lenses.

In embodiments, the set of illumination optics 816 may utilize a first focusing element 822 to focus and/or direct the beam onto the sample 207 disposed on the sample stage 812. In embodiments, the set of collection optics 818 may include a second focusing element 826 to collect illumination from the sample 707.

In embodiments, the detector assembly 828 is configured to capture illumination emanating from the sample 707 through the set of collection optics 818. For example, the detector assembly 828 may receive illumination reflected or scattered (e.g., via specular reflection, diffuse reflection, and the like) from the sample 707. By way of another example, the detector assembly 828 may receive illumination generated by the sample 707 (e.g., luminescence associated with absorption of the beam, and the like). It is noted that detector assembly 828 may include any sensor and detector assembly known in the art. For example, the sensor may include, but is not limited to, CCD detector, a CMOS detector, a TDI detector, a PMT, an APD, and the like.

The set of collection optics 818 may further include any number of collection beam conditioning elements 830 to direct and/or modify illumination collected by the second focusing element 826 including, but not limited to, one or more lenses, one or more filters, one or more polarizers, or one or more phase plates.

The system 800 may be configured as any type of metrology tool known in the art such as, but not limited to, a spectroscopic ellipsometer with one or more angles of illumination, a spectroscopic ellipsometer for measuring Mueller matrix elements (e.g., using rotating compensators), a single-wavelength ellipsometer, an angle-resolved ellipsometer (e.g., a beam-profile ellipsometer), a spectroscopic reflectometer, a single-wavelength reflectometer, an angle-resolved reflectometer (e.g., a beam-profile reflectometer), an imaging system, a pupil imaging system, a spectral imaging system, or a scatterometer.

A description of an inspection/metrology tools suitable for implementation in the various embodiments of the present disclosure are provided in U.S. Pat. No. 7,957,066, entitled "Split Field Inspection System Using Small Catadioptric Objectives," issued on Jun. 7, 2011; U.S. Pat. No. 7,345,825, entitled "Beam Delivery System for Laser Dark-Field Illumination in a Catadioptric Optical System," issued on Mar. 18, 2018; U.S. Pat. No. 5,999,310, entitled "Ultra-broadband UV Microscope Imaging System with Wide Range Zoom Capability," issued on Dec. 7, 1999; U.S. Pat. No. 7,525,649, entitled "Surface Inspection System Using Laser Line Illumination with Two Dimensional Imaging," issued on Apr. 28, 2009; U.S. Pat. No. 9,228,943, entitled "Dynamically Adjustable Semiconductor Metrology System," issued on Jan. 5, 2016; U.S. Pat. No. 5,608,526, entitled "Focused Beam Spectroscopic Ellipsometry Method and System," by Piwonka-Corle et al., issued on Mar. 4, 1997; and U.S. Pat. No. 6,297,880, entitled "Apparatus for Analyzing Multi-Layer Thin Film Stacks on Semiconductors," issued on Oct. 2, 2001, which are each incorporated herein by reference in their entirety.

The one or more processors 720 of a controller 718 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 720 may include any device configured to execute algorithms and/or instructions (e.g., program instructions stored in memory). In embodiments, the one or more processors 720 may be embodied as a desktop computer, mainframe computer system, workstation, image computer, parallel processor, networked computer, or any other computer system configured to execute a program configured to operate or operate in conjunction with the optical characterization system as described throughout the present disclosure.

The memory medium 722 may include any storage medium known in the art suitable for storing program instructions executable by the associated one or more processors 720. For example, the memory medium 722 may include a non-transitory memory medium. By way of another example, the memory medium 722 may include, but is not limited to, a read-only memory (ROM), a random-access memory (RAM), a magnetic or optical memory device (e.g., disk), a magnetic tape, a solid-state drive and the like. It is further noted that memory medium 722 may be housed in a common controller housing with the one or more processors 720. In embodiments, the memory medium 722 may be located remotely with respect to the physical location of the one or more processors 720 and controller 718. For instance, the one or more processors 720 of controller 718 may access a remote memory (e.g., server), accessible through a network (e.g., internet, intranet and the like).

In embodiments, the LSP broadband light source 500 and systems 700, 800, as described herein, may be configured as a "stand alone tool," interpreted herein as a tool that is not physically coupled to a process tool. In other embodiments, such an inspection or metrology system may be coupled to a process tool (not shown) by a transmission medium, which may include wired and/or wireless portions. The process tool may include any process tool known in the art such as a lithography tool, an etch tool, a deposition tool, a polishing tool, a plating tool, a cleaning tool, or an ion implantation tool. The results of inspection or measurement performed by the systems described herein may be used to alter a parameter of a process or a process tool using a feedback control technique, a feedforward control technique, and/or an in-situ control technique. The parameter of the process or the process tool may be altered manually or automatically.

Figure 9:
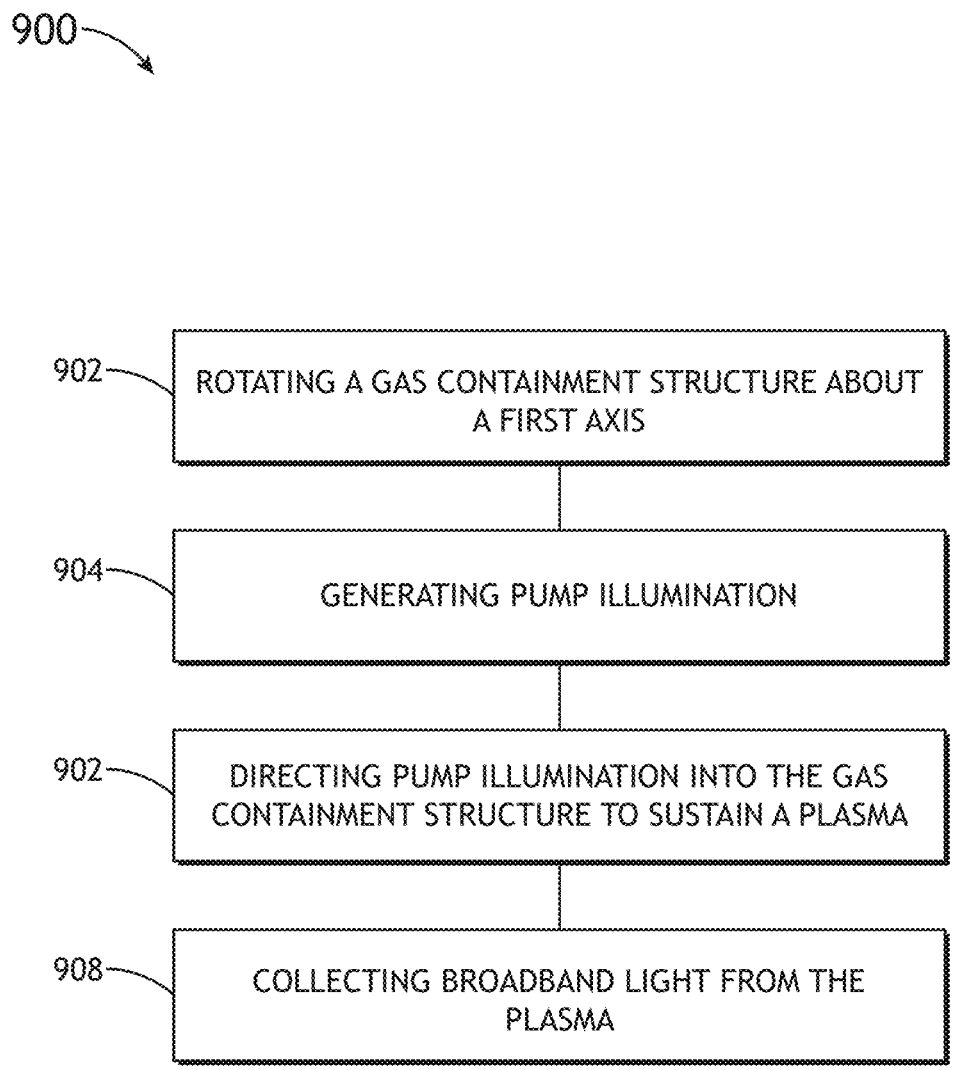
FIG. 9 is a flow diagram illustrating a method of generating laser-sustained broadband plasma illumination via a rotating gas containment structure, in accordance with one or more embodiments of the present disclosure.

FIG. 9 is a flow diagram illustrating a method 900 generating broadband illumination via an LSP broadband light source, in accordance with one or more embodiments of the present disclosure. It is noted herein that the steps of method 900 may be implemented all or in part by broadband light source 500 and/or systems 700, 800. It is further recognized, however, that the method 900 is not limited to the broadband light source 500 and/or systems 700, 800 in that additional or alternative system-level embodiments may carry out all or part of the steps of method 900.

In step 902, a gas containment structure is rotated.

In a step 904, a pump source generates pump illumination.

In a step 906, a reflector element is configured to direct a portion of the pump illumination into a gas in a rotatable gas containment structure to sustain a plasma.

In a step 908, the reflector element collects a portion of broadband light emitted from the plasma and directs the portion of broadband light to one or more downstream applications. The one or more downstream applications may include at least one of inspection, metrology, or lithography.

It is further contemplated that each of the embodiments of the method described above may include any other step(s) of any other method(s) described herein. In addition, each of the embodiments of the method described above may be performed by any of the systems described herein One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A broadband source comprising:
   a rotatable gas containment structure for containing a gas and maintaining a plasma;
   a rotational drive system configured to rotate the rotatable gas containment structure about an axis to suppress a convective plume from the plasma maintained within the rotatable gas containment structure;
   a pump source configured to generate pump illumination; and
   a reflector element configured to direct a portion of the pump illumination into the gas to sustain the plasma, wherein the reflector element is configured to collect at least a portion of broadband light emitted from the plasma, wherein the rotatable gas containment structure includes a transparent portion for transmitting the pump illumination into the rotatable gas containment structure and transmitting broadband illumination out of the rotatable gas containment structure.

2. The broadband source of claim 1, wherein the rotational drive system is configured to rotate the rotatable gas containment structure about a horizontal axis.

3. The broadband source of claim 2, wherein the reflector element is oriented such that a reflective surface of the reflector element receives the pump illumination along a horizontal direction.

4. The broadband source of claim 1, wherein the rotational drive system is configured to rotate the rotatable gas containment structure at a rotational speed sufficient to suppress a plume of the plasma.

5. The broadband source of claim 1, wherein the rotational drive system is configured to rotate the rotatable gas containment structure sufficient to produce a rotationally symmetric temperature distribution in the plasma.

6. The broadband source of claim 1, wherein the rotational drive system is configured to rotate the rotatable gas containment structure at a rotational speed between 10 and 20,000 RPM.

7. The broadband source of claim 6, wherein the rotational drive system is configured to rotate the rotatable gas containment structure at a rotational speed between 1000 and 8000 RPM.

8. The broadband source of claim 6, wherein the rotational drive system is configured to rotate the rotatable gas containment structure at a rotational speed between 10 and 600 RPM.

9. The broadband source of claim 1, wherein the reflector element comprises an elliptical or parabolical reflector element.

10. The broadband source of claim 1, wherein the rotational drive system comprises:
    a motor; and
    a shaft, wherein the shaft is coupled to the rotatable gas containment structure and the motor is configured to rotate the rotatable gas containment structure via the shaft.

11. The broadband source of claim 10, wherein the shaft passes through an open access hole of the reflector element.

12. The broadband source of claim 1, wherein the pump source comprises:
    one or more lasers.

13. The broadband source of claim 12, wherein the pump source comprises:
    at least one of an infrared laser, a visible laser, or an ultraviolet laser.

14. The broadband source of claim 1, wherein the reflector element is configured to collect at least one of broadband UV, VUV, or DUV light from the plasma.

15. The broadband source of claim 1, wherein the gas comprises:
    at least one of argon, krypton, xenon, neon, nitrogen, or oxygen.

16. The broadband source of claim 1, wherein the rotatable gas containment structure comprises:
    at least one of a plasma bulb, a plasma cell, or a plasma chamber.

17. The broadband source of claim 1, wherein the rotatable gas containment structure comprises:
    a plasma chamber, wherein the reflector element is configured as a wall of the plasma chamber.

18. The broadband source of claim 1, further comprising:
    one or more additional collection optics configured to direct a broadband light output from the plasma to one or more downstream applications.

19. The broadband source of claim 18, wherein the one or more downstream applications comprises at least one of inspection or metrology.

20. A characterization system comprising:
    a broadband illumination source comprising:
        a rotatable gas containment structure for containing a gas;
        a rotational drive system configured to rotate the rotatable gas containment structure about an axis to suppress a convective plume from the plasma maintained within the rotatable gas containment structure;
        a pump source configured to generate pump illumination; and
        a reflector element configured to direct a portion of the pump illumination into the gas to sustain a plasma, wherein the reflector is configured to collect at least a portion of broadband light emitted from the plasma, wherein the rotatable gas containment structure includes a transparent portion for transmitting the pump illumination into the rotatable gas containment structure and transmitting broadband illumination out of the rotatable gas containment structure;
a set of illumination optics configured to direct broadband light from the broadband illumination source to one or more samples;
a set of collection optics configured to collect light emanating from the one or more samples; and
a detector assembly.

21. A method for generating broadband illumination comprising:
rotating a rotatable gas containment structure about an axis to suppress a convective plume from the plasma maintained within the rotatable gas containment structure;
generating pump illumination with a pump source;
directing, with a reflector element, a portion of the pump illumination into a gas in the rotatable gas containment structure to sustain a plasma; and
collecting a portion of broadband light emitted from the plasma with the reflector element and directing the portion of broadband light to one or more downstream applications.

* * * * *